United States Patent [19]

Kiehl

[11] Patent Number: 5,485,123
[45] Date of Patent: Jan. 16, 1996

[54] CIRCUIT CONFIGURATION FOR ADJUSTING THE QUADRATURE-AXIS CURRENT COMPONENT OF A PUSH-PULL OUTPUT STAGE

[75] Inventor: Oliver Kiehl, München, Germany

[73] Assignee: Siemens Aktiengesellschaft, Munich, Germany

[21] Appl. No.: 301,709

[22] Filed: Sep. 6, 1994

[30] Foreign Application Priority Data

Sep. 3, 1993 [DE] Germany ................ 43 29 865.6

[51] Int. Cl.⁶ .................................................. H03F 3/30
[52] U.S. Cl. ............................................ 330/264; 330/267
[58] Field of Search ................................ 330/255, 264, 330/265, 267, 268, 270

[56] References Cited

U.S. PATENT DOCUMENTS

| | | |
|---|---|---|
| 3,686,580 | 8/1972 | Van Den Plassche . |
| 4,439,743 | 3/1984 | Schwarz et al. . |
| 4,752,745 | 6/1988 | Pass . |
| 4,888,559 | 12/1989 | Sevenhans et al. ............... 330/264 X |

FOREIGN PATENT DOCUMENTS

| | | |
|---|---|---|
| 0409476 | 1/1991 | European Pat. Off. . |
| 0420183 | 4/1991 | European Pat. Off. . |
| 28665 | 2/1980 | Japan ............................ 330/267 |
| 2219456 | 12/1989 | United Kingdom . |

OTHER PUBLICATIONS

Data Sheet NE/SA 5230, published by Valvo, Nov. 14, 1986, pp. 429–440.
IEEE Journal of Solid-State Circuits 25 (1990) Feb. No. 1, "A CMOS Large-Swing Low-Distortion Three-Stage Class AB Power Amplifier".

*Primary Examiner*—James B. Mullins
*Attorney, Agent, or Firm*—Herbert L. Lerner; Laurence A. Greenberg

[57] ABSTRACT

A circuit configuration for adjusting the quadrature-axis current component of a push-pull output stage has two transistors of opposed conduction type and is triggered by an input signal. A variable being proportional to the quadrature-axis current component of the push-pull output stage is derived from a comparison circuit. A final control element adjusts the quadrature-axis current components of the push-pull output stage and of the comparison circuit for matching the variable to a reference variable.

1 Claim, 2 Drawing Sheets

CIRCUIT CONFIGURATION FOR ADJUSTING THE QUADRATURE-AXIS CURRENT COMPONENT OF A PUSH-PULL OUTPUT STAGE

BACKGROUND OF THE INVENTION

FIELD OF THE INVENTION

The invention relates to a circuit configuration for adjusting the quadrature-axis current component of a push-pull output stage having two transistors of opposite conduction type.

Such a circuit configuration is known, for instance, from Data Sheet NE/SA 5230 published by the firm Valvo on Nov. 14, 1986. In that device, a voltage across two series-connected diodes through which a reference current flows is compared with a sum of base-to-emitter voltages of the push-pull output stage transistors, and the quadrature-axis current component of the push-pull output stage is adjusted as a function thereof. Since the base-to-emitter voltages of the output stage transistors are proportional to the logarithm of the current flowing through them, the product of the current flowing through each of the output stage transistors is accordingly kept constant with respect to the logarithm of the reference current. In order to partially compensate for the temperature dependency of the logical relationship between the base-to-emitter voltage and the collector current in a transistor, the diodes have a corresponding temperature dependency. However, in order to attain greater accuracy a considerable additional expenditure for circuitry would be needed. Furthermore, in the known circuit configuration the accuracy is reduced even further by the fact that load changes, which influence the current in only one of the two output stage transistors, have an overall effect on the adjustment of the quadrature-axis current component, because of the product formed by the logarithmizing and ensuing addition.

SUMMARY OF THE INVENTION

It is accordingly an object of the invention to provide a circuit configuration for adjusting the quadrature-axis current component of a push-pull output stage that has two transistors of opposed conduction type and is triggered by an input signal, which overcomes the hereinafore-mentioned disadvantages of the heretofore-known devices of this general type and which has greater accuracy at little expenditure for circuitry.

With the foregoing and other objects in view there is provided, in accordance with the invention, in a circuit configuration for adjusting the quadrature-axis current component of a push-pull output stage having two transistors of opposed conduction type and being triggered by an input signal, the improvement comprising a comparison circuit from which a variable being proportional to the quadrature-axis current component of the push-pull output stage is derived; and a final control element adjusting the quadrature-axis current components of the push-pull output stage and of the comparison circuit for matching the variable supplied to it to a reference variable.

Since the circuit configuration is not determined directly in the push-pull output stage itself but rather is derived from a comparison network, load changes have no effect whatever.

In accordance with another feature of the invention, two current sources being controlled by the input signal, furnishing currents of equal magnitude of opposite polarity and being coupled to one another through a controllable load, are provided as the final control element and in turn trigger one of the two transistors of the push-pull output stage as well as the comparison circuit.

In accordance with a further feature of the invention, the controllable load includes two field effect transistors of opposed conduction type being triggered in phase opposition with one another and having load paths being connected antiparallel to one another.

In accordance with an added feature of the invention, the comparison circuit includes a further push-pull output stage having a quadrature-axis current component being ascertained and compared with a reference current, and the load being controlled as a function thereof.

In accordance with an additional feature of the invention, the comparison circuit includes two constant current sources furnishing currents of equal magnitude of opposite polarity, each of the constant current sources supplying one of two further transistors of opposite conduction type, the further transistors each being triggered by one of the controlled current sources, and the voltage drop at the load paths of each of the further transistors being provided for triggering the respective field effect transistors.

In accordance with a concomitant feature of the invention, there are provided additional transistors each having a load path being connected in series with the load path of a respective one of the further transistors, being of the same conduction type as the respective one of the further transistors, and being triggered by a voltage drop across the load path of the respective one of the further transistors.

Other features which are considered as characteristic for the invention are set forth in the appended claims.

Although the invention is illustrated and described herein as embodied in a circuit configuration for adjusting the quadrature-axis current component of a push-pull output stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
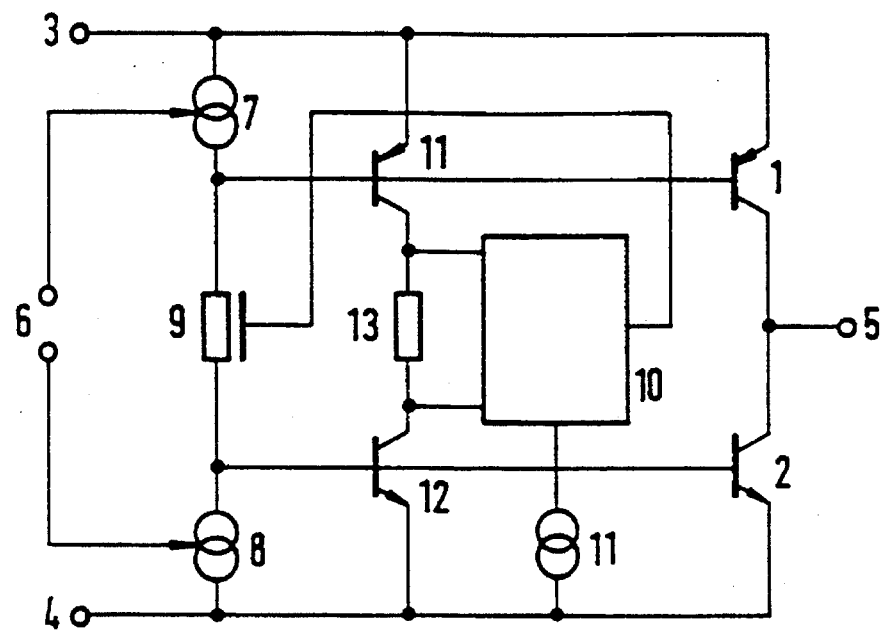
FIG. 1 is a schematic diagram of a first exemplary embodiment of a circuit configuration according to the invention.

Referring now to the figures of the drawing in detail and first, particularly, to FIG. 1 thereof, there is seen an exemplary embodiment having a push-pull output stage made up of bipolar transistors 1, 2. The transistor 1 is a pnp type transistor having an emitter which is connected to a positive supply potential 3 and having a collector which is connected to a collector of the transistor 2 which is of the npn type. An emitter of the transistor 2 is correspondingly connected to a negative supply potential 4. An output signal 5 that is proportional to a differential input signal 6 can be picked up at the coupled collectors of the transistors 1 and 2.

Base-to-emitter paths of the transistors 1 and 2 are each supplied by current sources 7 and 8 that are connected parallel to these transistors, are triggered by the input signal 6, and furnish currents of equal magnitude and mutually opposite polarity. A controllable load 9, which is triggered by an evaluation device 10, is connected between the bases of the transistors 1 and 2. The evaluation unit 10 adjusts its resistance 9 in such a way that the quadrature-axis current component flowing through a comparison output stage is equal to a reference current generated by a current source 11. The comparison output stage includes two bipolar transistors, namely a pnp transistor 11 and an npn transistor 12, having base and emitter terminals which are each connected to the respective base and emitter terminals of the transistors 1 and 2. A current measuring device, for instance in the form of a resistor 13, is connected between collectors of the transistors 11 and 12. A voltage drop across the resistor 13 that is brought about by the quadrature-axis current component is compared by the evaluation device 10 with a voltage drop that is brought about by the reference current, at an identical non-illustrated resistor.

Figure 2:
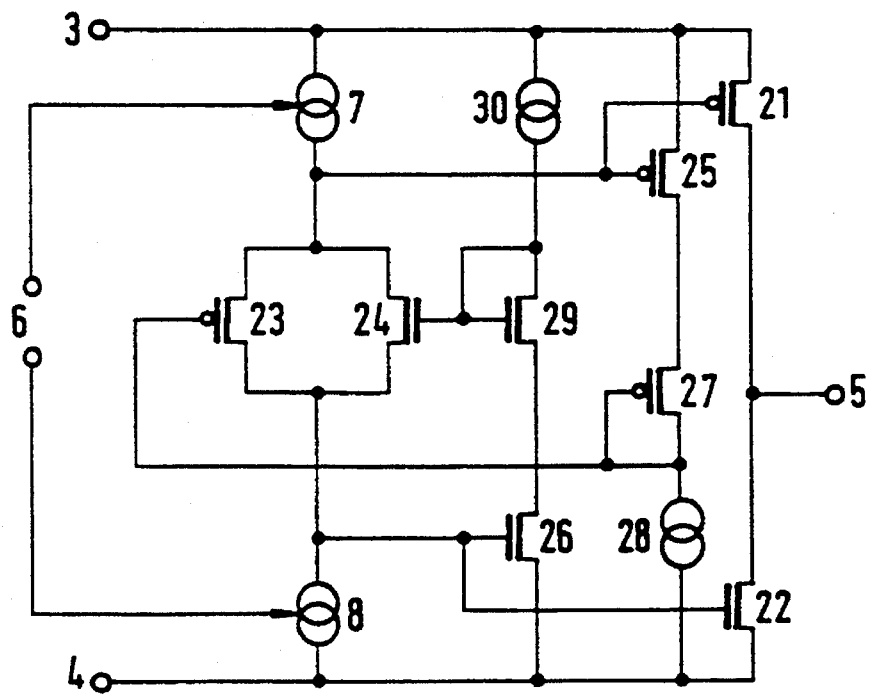
FIG. 2 is a schematic diagram of a second exemplary embodiment of a circuit configuration according to the invention.

In the exemplary embodiment of FIG. 2, the push-pull output stage includes an MOS field effect transistor 21 of the p-channel type having a source terminal which is connected to the positive supply potential 3, and an MOS field effect transistor 22 of the n-channel type having a source terminal which is connected to the negative supply potential 4. The output signal 5 can be picked up at coupled-together drain terminals of the two transistors. The current sources 7 and 8 which are triggered by the input signal 6 are each connected between gate and source terminals of a respective one of the transistors 21 and 22 in this embodiment. Two MOS transistors 23 and 24, which are of different conduction types and have drain-to-source paths which are connected antiparallel to one another, are used as the controllable resistor in this case.

Gate and source terminals of a p-channel MOS field effect transistor 25 and an n-channel MOS field effect transistor 26 are respectively connected to the gate and source terminals of the transistors 21 and 22. A drain terminal of the transistor 25 is connected to the negative supply potential 4, with the interposition of a diode 27 in the conducting direction and of a current source 28. In the same way, a drain terminal of the transistor 26 is connected through a diode 29 in the conducting direction and a current source 30, to the positive supply potential 3. A pickup between the diode 27 and the current source 28 is coupled to a gate terminal of the p-channel transistor 23, and a pickup between the current source 30 and the diode 29 is coupled to a gate terminal of the n-channel transistor 24. In the event that an increase in distortion is tolerable, the two diodes 27 and 29 may also be omitted and replaced with a short circuit. Thus according to the invention, in both illustrated exemplary embodiments, the determination of the quadrature-axis current component is not derived directly from the actual push-pull output stage but rather from a comparison circuit which, for example, includes a similar push-pull output stage, or in accordance with FIG. 2 includes a configuration in which the comparison push-pull output stage is split into two branches, each of which corresponds to one of the output stage transistors. Accordingly, the transistors 11 and 1, and the transistors 12 and 2, have a proportional behavior in the configuration of FIG. 1, while in FIG. 2 the transistors 21 and 25, and the transistors 22 and 26, have a proportional behavior. Proportional behavior means that the quadrature-axis current component of the comparison push-pull output stage can be less, by a certain factor, than that of the actual push-pull output stage, or that the currents, which are impressed by the current sources 28 and 30 and are identical to one another, are likewise smaller by a certain factor than the quadrature-axis current component of the actual push-pull output stage, and fluctuations have an effect in the same proportion. This substantially lowers current consumption of the overall configuration. As is particularly apparent from the exemplary embodiment of FIG. 2, fast and stable adjustment of the quadrature-axis current component of a push-pull output stage is possible with the circuit configuration of the invention at little expenditure for circuitry.

Figure 3:
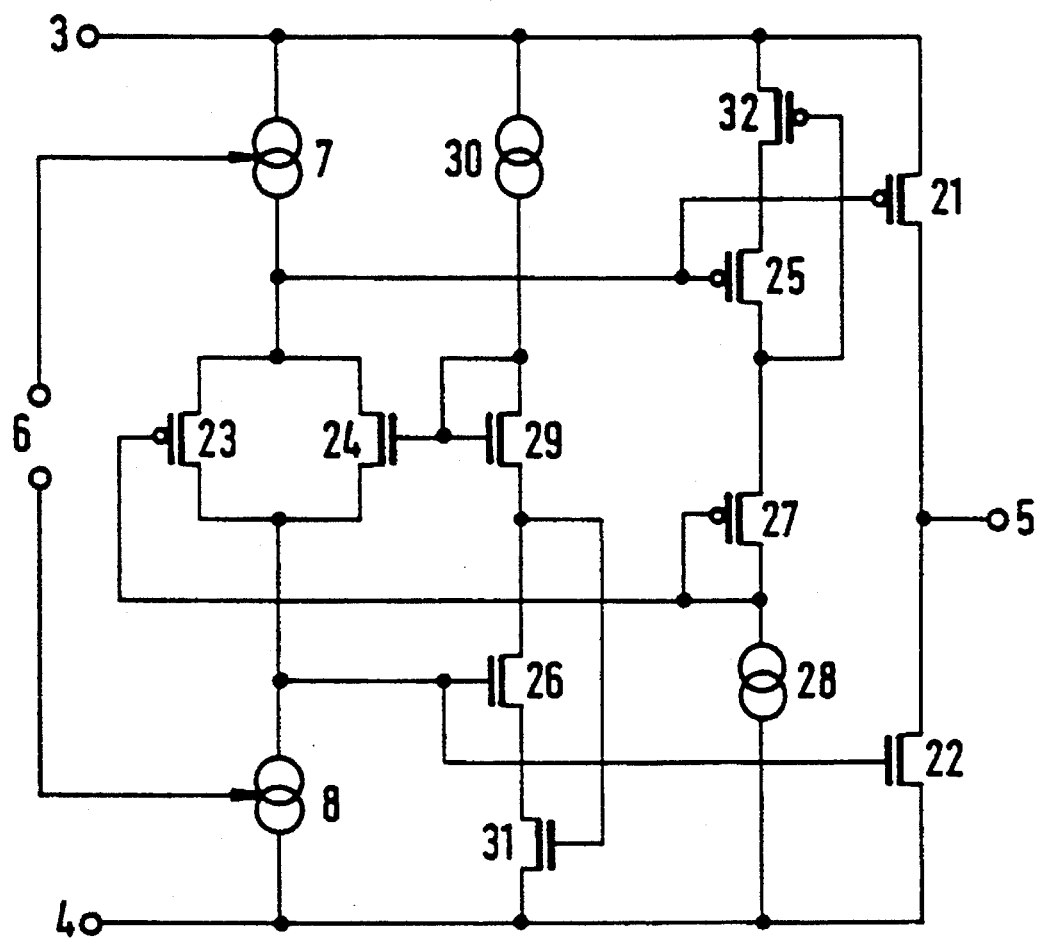
FIG. 3 is a schematic diagram of a third embodiment of a circuit configuration according to the invention.

The exemplary embodiment of FIG. 3 is modified as compared to FIG. 2 in that the source terminal of the transistor 25 is applied to a drain terminal of a p-channel MOS field effect transistor 32 which has a source terminal that is connected to the positive supply potential 3 and has a gate terminal that is connected to the drain terminal of transistor 25. Correspondingly, the source terminal of the transistor 26 is connected to a drain terminal of an n-channel MOS field effect transistor 31 which has a source terminal that is coupled to the negative supply potential 4 and has a gate terminal that is coupled to the drain terminal of the transistor 26. A greater absence of distortion is achieved by means of these provisions.

Finally, each transistor within the following groups of transistors has the same channel length: the transistors 22, 26, 31; the transistors 24 and 29; the transistors 27, 23; and the transistors 21, 25 and 37. The ratios of the channel widths of the transistors 29 and 24 to each other; the transistors 27 and 23 to each other; the transistors 26 and 31 to each other; and the transistors 25 and 32 to each other, vary in a range of from ½ to ¼. The resting current of the current sources 7, 30, 8 and 28 are also intended to be on the same order of magnitude.

I claim:

1. In a circuit configuration for adjusting the quadrature-axis current component of a push-pull output stage having two transistors of opposed conduction type and being triggered by an input signal, the improvement comprising:

a comparison circuit from which a variable being proportional to the quadrature-axis current component of the push-pull output stage is derived;

a final control element adjusting the quadrature-axis current components of the push-pull output stage and of said comparison circuit for matching the variable to a reference variable;

said final control element including two current sources being controlled by the input signal and furnishing currents of equal magnitude and opposite polarity, and a controllable load coupling said current sources to one another;

said current sources in turn triggering one of said two transistors of the push-pull output stage and said comparison circuit;

said controllable load including two field effect transistors of opposed conduction type being triggered in phase opposition with one another and having load paths being connected antiparallel to one another;

two further transistors having opposite conduction types and having load paths;

said comparison circuit including two constant current sources furnishing currents of equal magnitude and opposite polarity, each of said constant current sources supplying a respective one of said two further transistors;

each of said further transistors being triggered by respective one of said controlled current sources;

voltage drops at the load paths of each of said further transistors triggering a respective one of said field effect transistors; and additional transistors each having a load path being connected in series with the load path of a respective one of said further transistors, being of the same conduction type as said respective one of said further transistors, and being triggered by a voltage drop across the load path of said respective one of said further transistors.

* * * * *